(12) United States Patent
Tomari

(10) Patent No.: US 6,795,356 B2
(45) Date of Patent: Sep. 21, 2004

(54) WRONG OPERATION PREVENTING CIRCUIT IN SEMICONDUCTOR UNIT

(75) Inventor: Nobuhiro Tomari, Miyazaki (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/420,743

(22) Filed: Apr. 23, 2003

(65) Prior Publication Data

US 2004/0071027 A1 Apr. 15, 2004

(30) Foreign Application Priority Data

Oct. 9, 2002 (JP) ........................................ 2002-296165

(51) Int. Cl.[7] ................................................. G11C 7/00

(52) U.S. Cl. ........................ 365/201; 365/194; 365/203; 365/233

(58) Field of Search ................................ 365/201, 194, 365/203, 233

(56) References Cited

U.S. PATENT DOCUMENTS 5,838,896 A 11/1998 Han ............................ 714/23
6,075,731 A * 6/2000 Hamakawa et al. ........ 365/196

FOREIGN PATENT DOCUMENTS

| JP | 61-148696 | 7/1986 |
| JP | 04-043436 | 2/1992 |
| JP | 06-068684 | 3/1994 |
| JP | 07-244537 | 9/1995 |
| JP | 08-230651 | 9/1996 |
| JP | 10-326125 | 12/1998 |

* cited by examiner

Primary Examiner—Anh Phung
Assistant Examiner—Pho M. Luu
(74) Attorney, Agent, or Firm—Rabin & Berdo, P.C.

(57) ABSTRACT

The wrong operation preventing circuit is supplied for preventing such accidents as destruction of data, a memory cell section, a sense amplifier and a operation judgement section. The memory cell section is placed at a furthest position from the sense amplifier, the sense amplifier detects the change of voltage on bit line, and the operation judgement section monitors the output of the sense amplifier and outputs a signal for controlling whether the CPU needs to reset.

5 Claims, 8 Drawing Sheets

*PRIOR ART*

WRONG OPERATION PREVENTING CIRCUIT IN SEMICONDUCTOR UNIT

BACKGROUND OF THE INVENTION

1. Field of the Invention

The invention relates to a wrong operation preventing circuit in semiconductor unit, used for preventing data destruction of semiconductor memory and the like from happening.

2. Related Background Art

In semiconductor unit, for example, microcomputer with one chip, internal circuit is operated according to the input of clock signal with high frequency. Such clock signal, however, changes due to some reason, thereby, when its frequency rises over a definite upper limit value, the internal circuit will occurs wrong operation. By such wrong operation, some trouble will happen, for example, either data stored in the internal circuit will be destroyed, or secret information will be stolen. In order to prevent such trouble from happening, in the past, the following wrong operation preventing circuit is used.

FIG. 8 is a structure diagram of conventional wrong operation preventing circuit.

Figures 8A, 8B, 8C:
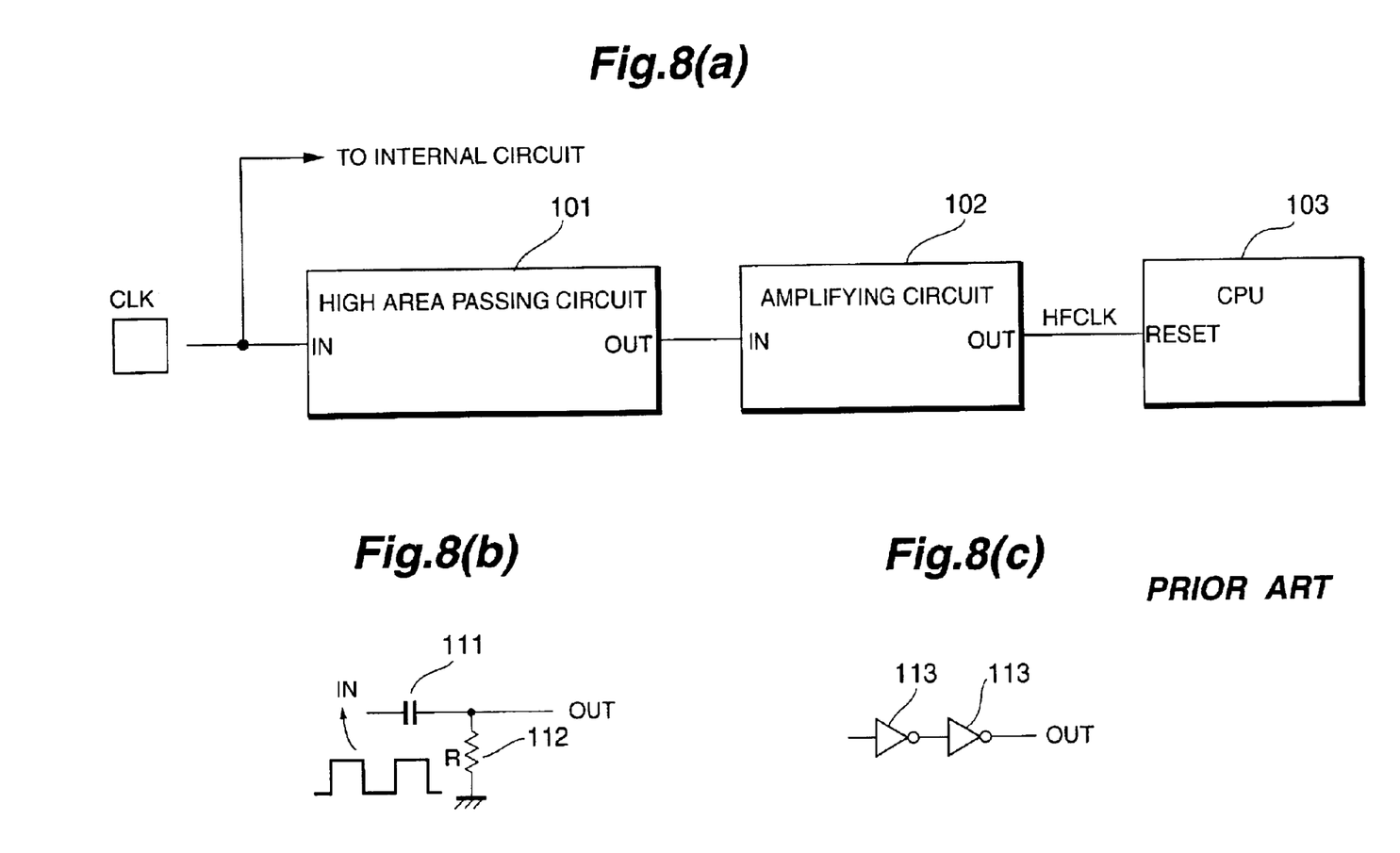
FIG. 8 is a circuit diagram showing a structure of prior art.

The conventional wrong operation preventing circuit is exclusively installed within semiconductor unit, and comprises mutually connecting both of a high area passing circuit 101 and a amplifying circuit 102 as shown by FIG. 8(a).

The high area passing circuit 101, as shown by FIG. 8(b), is formed from condenser 111 and resistance 112; its input terminal is connected with clock signal line. The amplifying circuit 112, as shown by FIG. 8(c), is formed from two inverters 113, 113; its output terminal is connected with central processing unit (CPU) 103.

In such wrong operation preventing circuit, when the frequency of clock signal rose over a definite value i.e. predetermined upper limit value, the high area passing circuit 101 outputs a "H" signal, then, the amplifying circuit 102 amplifies the "H" signal and output a "HFCLK" signal to the CPU 103. Thus, the CPU 103 is reset.

But, in semiconductor unit, with respect to the occurrence of wrong operation, not only being because of the rising of clock signal, but also being because of that, for example, the rising of temperature in itself due to access time for memory. Thereby, in the latter case, for example, such structure is used, which is disclosed by patent document of Japan patent publication No. 10-326125. That is, using a temperature sensor to measure the temperature of semiconductor unit, if the temperature is over predetermined temperature, then using a cooling fan to cool the semiconductor unit.

However, on the one hand, with respect to the plural of semiconductor units with mass production, their clock signal frequencies capable of normally operating i.e. the upper limit value of operating frequencies are different from each other. On the other hand, in the conventional wrong operation preventing circuit as stated above, such structure to output a reset signal only based on unique predetermined upper limit value is supplied. Thus, for applying in common such structure to all semiconductor units, it is necessary to respectively set such an upper limit value as predetermined upper limit value that is corresponding to a semiconductor unit whose upper limit value of operating frequency is smallest, in all semiconductor units.

Because of this, with respect to such semiconductor unit whose upper limit value of operating frequency is bigger, sometime, its CPU will be reset even if do not need to be reset. Therefore, such problem as that the decline of processing efficiency of semiconductor unit existed.

Further, as stated above, in such case that using a cooling device described by above mentioned patent document to solve the rising of temperature, semiconductor unit will become big and expensive.

Thus, in the prior art, such above stated problems to be solved was left.

SUMMARY OF THE INVENTION

To solve the conventional problems as mentioned above, the following structures are used.

According to the invention, there is provided a wrong operation preventing circuit for preventing the wrong operation of semiconductor unit including memory and CPU from happening, comprising:

a detection use memory cell section serving as a judgement object of the wrong operation, which is installed at the memory and is formed from at least one memory cell;

a bit line which is connected with the detection use memory cell section and is added by pre-charge voltage synchronizing with clock signal;

a voltage detection section for detecting the dropping of the pre-charge voltage added on the bit line;

a operation judgement section which outputs a reset signal to the CPU when the dropping voltage detected by the voltage detection section is bigger than a predetermined value.

In the wrong operation preventing circuit, the detection use memory cell section may be any one of memory cell portions used for forming the memory.

Also, the detection use memory cell section may be a memory cell portion newly formed at the memory for detection exclusive use.

Further, in the wrong operation preventing circuit, the bit line may have a longest length than other bit lines connected with the memory.

Also, the bit line may have a delay element.

The above and other objects and features of the present invention will become apparent from the following detailed description and the appended claims with reference to the accompanying drawings.

DETAILED DESCRIPTION OF THE PREFERRED EMBODIMENTS

In prior art stated above, it is estimated that the wrong operation of the semiconductor unit will happen when the frequency of clock signal is over a predetermined value, then, all semiconductor unit with mass production are decided with such predetermined value. Thus, in each semiconductor unit, when the frequency of clock signal is over the predetermined value, CPU will be automatically reset. Therefore, the destruction of data or the like can be prevented from happening.

However, the happening of wrong operation of semiconductor unit also may be due to the rising of temperature; and with respect to each semiconductor unit, its happening cause is different from other semiconductor units. Further, in semiconductor unit, it is known that its memory will easiest cause wrong operation. This is because that the memory receives digital signal and outputs response signal, but the transition characteristic of the response signal will greatly influence the operation of the semiconductor unit.

Based on the above premises, in the present invention, a memory cell section which is used for detecting wrong operation and has a same structure as other memory cell in memory used for storing program is placed at such position easiest causing wrong operation. Then, a operation judgement section used for monitoring the memory cell section and for detecting wrong operation, like the memory cell section, is also placed in semiconductor unit. The operation judgement section, at the first stage of that the happening of wrong operation is detected, reset CPU. Thereby, such accident as destruction of data or the like can be prevented from happening.

With such processing, with respect to each semiconductor unit, its CPU is reset only at the first stage of that the wrong operation happened exactly. Therefore, with respect to all semiconductor units with mass production, it is not necessary to consider their unevenness, each of them will have an exact operating range, that is, most of them will have wider operating range. Further, because the memory cell section and the operation judgement section are respectively formed by similar circuit structure of other part, so it is not necessary to add a producing process. As a result, it is possible to reduce the cost of production.

The follows, the present invention will now be described herein on the basis of embodiments shown in the diagrams.
<Embodiment 1>

Figure 1:
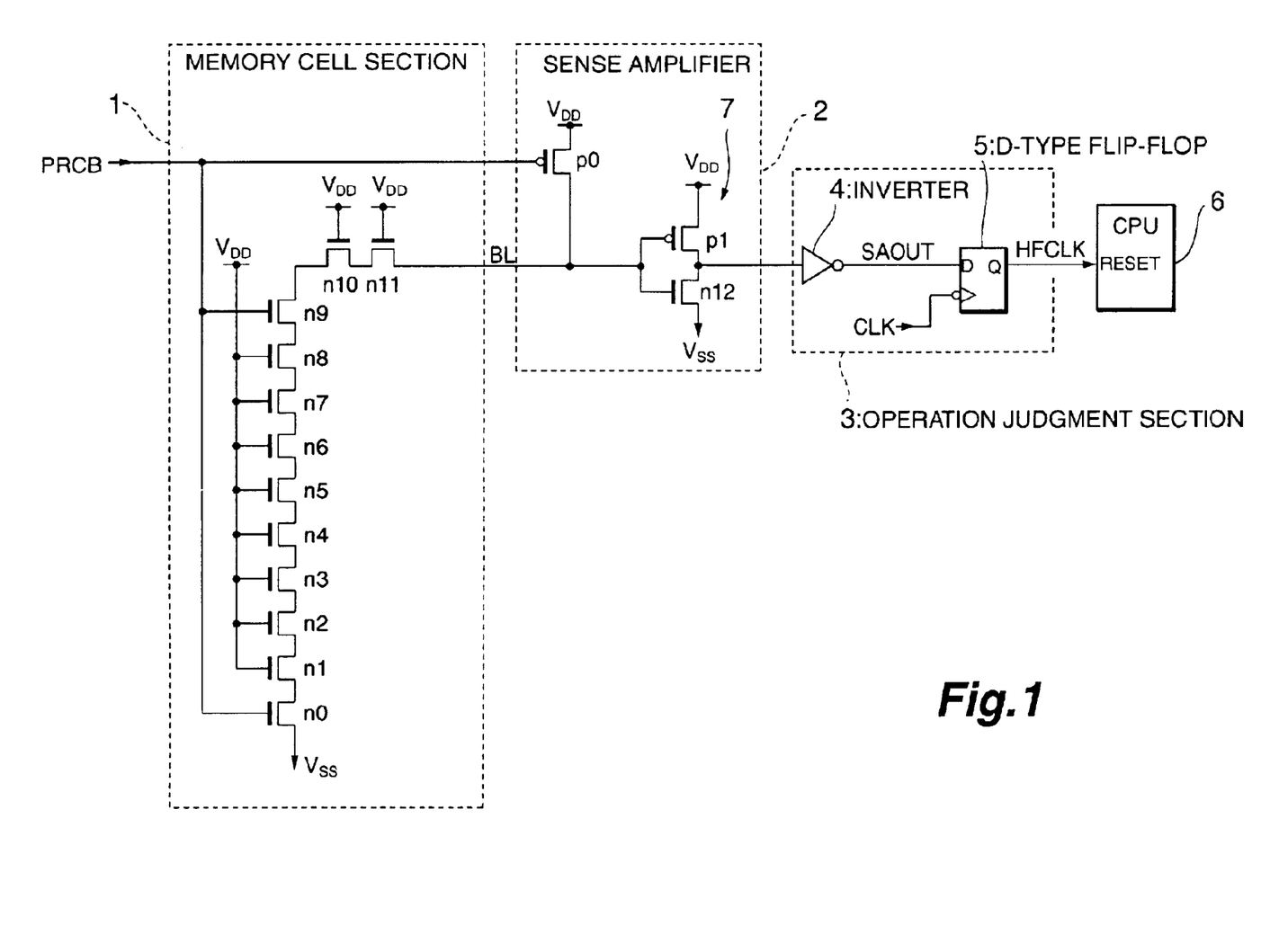
FIG. 1 is a circuit diagram showing a wrong operation preventing circuit of embodiment 1 of the present invention.

FIG. 1 is a circuit diagram showing a wrong operation preventing circuit of embodiment 1 of the present invention.

The wrong operation preventing circuit, as shown by FIG. 1, comprises a memory cell section 1 as a detecting use memory cell section; a sense amplifier 2 as a voltage detection section; and a operation judgement section 3. Here, as an example, semiconductor unit contains ROM (Read Only Memory).

The memory cell section 1 is constructed by twelve N-channel transistors n0~n11, has the same memory cell structure as other memory cell used for storing program. Further, the memory cell section 1 is newly installed in semiconductor unit for preventing wrong operation of semiconductor unit, and had best be placed at a far position left the most from sense amplifier 2.

If it is difficult to place the memory cell section 1 at such far position due to the reason of layout of semiconductor unit, it is desirable to place a delay element in bit line. Thus, the equivalent state can be obtained. The memory cell section 1, when being placed at the far position, will easiest cause wrong operation, concerning with the reason, it will be explained in detail hereinafter.

On each gate of transistors n0 and n9, pre-charge signal (PRCB) is input, on each gate of transistors n1~n8, n10 and n11, power source voltage signal (VDD) is added. That is, only on the gates of the transistors n0 and n9, the PRCB signal is input, and on the other gates, VDD is added. Such structure can be changed according to the change of the kind of semiconductor unit.

Further, on the source of transistor n0, ground voltage (VSS) is added; the transistors n0~n11 are connected with in series each other such as the drain of the transistor n0 is connected with the source of transistor n1, the drain of the transistor n1 is connected with the source of transistor n2, ..., and the drain of the transistor n10 is connected with the source of transistor n11; and the drain of the transistor n11 is connected with the sense amplifier 2 via bit line.

The sense amplifier 2 is used for detecting the change of voltage level on bit line (BL). In the sense amplifier 2, there is a inverter 7 formed by a transistor p1 with P channel type and a transistor n12 with N channel type.

The inverter 7 is placed between the ground voltage (VSS) and the power source voltage (VDD), its input terminal is connected with the bit line, and its output terminal is connected with the operation judgement section 3. Further, on the input terminal, via transistor p0, pre-charge signal (PBCB) is input.

In the inverter 7, when the input signal rises over the rising threshold value in itself from VSS, the output signal will change into "L" level; when the input signal drops under the dropping threshold value in itself from VDD, the output signal will change into "H" level.

The operation judgement section 3 is used for receiving the output signal of sense amplifier 2 and for detecting the wrong operation of memory cell section 1. The operation judgement section 3 is placed in semiconductor unit and includes a inverter 4 and a D-type flip-flop circuit 5. The inverter 4 receives the output signal of sense amplifier 2 and outputs a SAOUT signal. When the output signal output from inverter 7 indicates "L" level, the SAOUT signal becomes high level i.e. "H" level; when the output signal output from inverter 7 indicates "H" level, the SAOUT signal becomes low level i.e. "L" level.

The D-type flip-flop circuit 5 receives the SAOUT signal and clock signal, while the clock signal drops, latches the SAOUT signal and outputs a HFCLK signal to CPU6. In the D-type flip-flop circuit 5, only in this case that the clock signal starts to drop when the SAOUT signal is indicating "H" level, the HFCLK signal will change into "H" level from low level. If the HFCLK indicates high level, the CPU 6 will be reset.

<Operations of the Embodiment 1>

Figure 2:
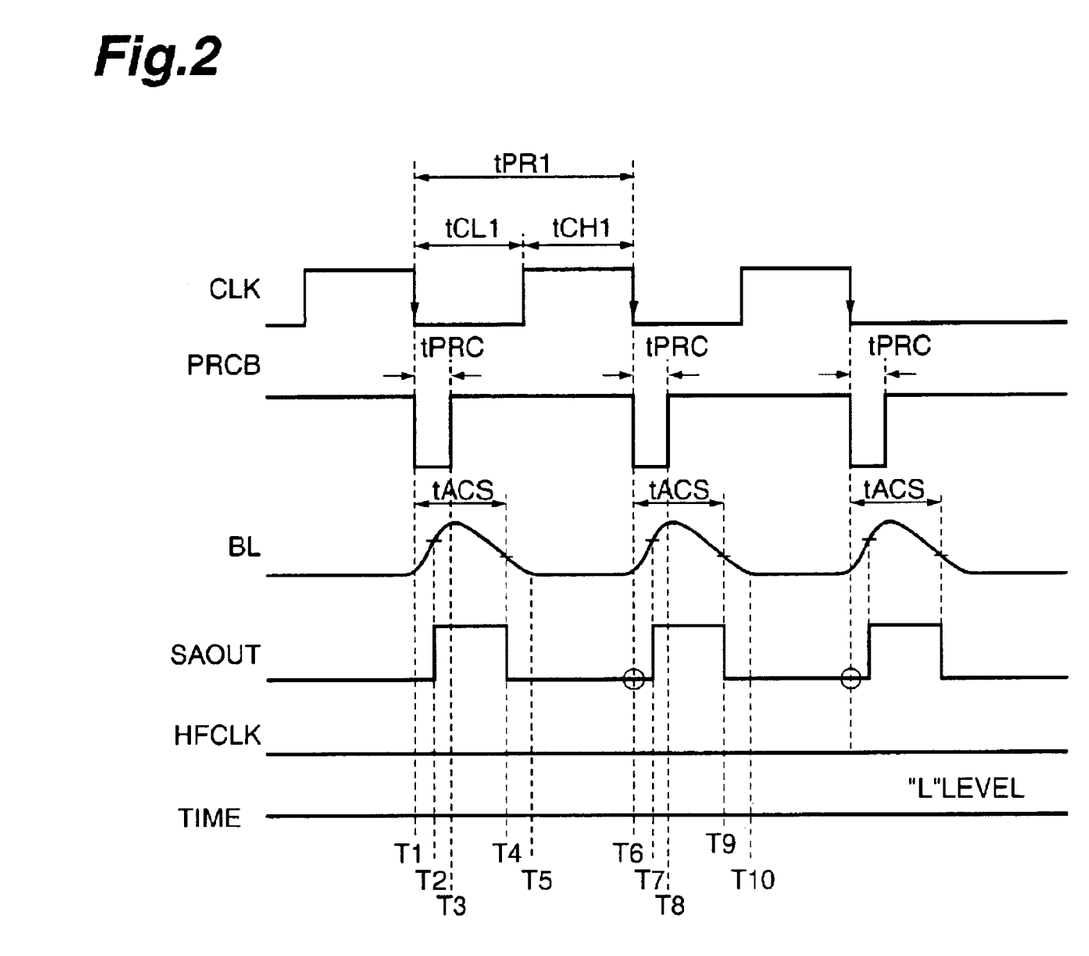
FIG. 2 is a timing chart showing states of signals in the wrong operation preventing circuit of embodiment 1 of the present invention while clock signal is normal.

FIG. 2 is a timing chart showing states of signals in the wrong operation preventing circuit of embodiment 1 of the present invention while clock signal is normal.

In the FIG. 2, in sequence, the waveform of the clock signal (CLK), the waveform of the pre-charge signal (PRCB), the changing waveform of the bit line (BL), the output waveform of the inverter 4 (SAOUT), the waveform of HFCLK signal (HFCLK) and the time (T) are respectively showing.

The follows, the normal operations in the circuit of the embodiment 1 will be explained along the time.

<Time T1>

At this time, the clock signal starts to drop, and the while, the pre-charge signal (PRCB) becomes low level (i.e. "L" level).

Thus, on the one hand, the transistor p0 becomes on and the power source voltage (VDD) is added on the bit line.

On the other hand, just before T1, all of the transistors n0~n1 were on, and since the under terminal is connected with the ground voltage (VSS), the voltage on the bit line was "0" volt. But, at the time T1, because the pre-charge signal indicating "L" level is added respectively on the gates of the transistors n0 and n9, the transistors n0 and n9 become off. Thus, the transistor series formed from transistors n0~n11 is cut off, so the bit line becomes open state. Then, based on the resistance of the bit line and the transition response depending upon the floating capacity between the bit line and the ground, the voltage on the bit line starts to rise toward the VDD.

<Time T2>

At this time, the voltage on the bit line further rises, and when it is over the rising threshold value of the inverter 7, the output signal SAOUT rises into "H" level at once.

<Time T3>

At this time, the pre-charge signal changes into "H" level.

Then, the transistor p0 becomes off, and the transistors n0 and n9 respectively become on. Thus, the electric charge accumulated from time T1 to time T2, as floating capacity, starts to discharge based on the resistance of the bit line and the transition response depending upon the floating capacity between the bit line and the ground.

In accordance with such discharging, the voltage on the bit line starts to drop. In other words, the time to be need for dropping is corresponding to the floating capacity and the resistance.

<Time T4>

At this time, the voltage on the bit line further drops, and if it became under the dropping threshold value of inverter 7, the output signal SAOUT drops into "L" level at once.

<Time T5>

At this time, the voltage on the bit line drops into VSS.

<Time T6>

From time T5 to time T6, the voltage on the bit line is keeping in VSS. At the time T6, all signals respectively returned the states of time T1. That is, the interval from T1 to T6 forms a cycle of clock signal, then corresponding to the cycle (tPR1) of clock signal, the other signals cyclically completed respective operations of one cycle.

Thus, as shown by FIG. 2, the D-type flip-flop circuit 5 latches the SAOUT signal while the clock signal starts to drop, and outputs a HFCLK signal indicating "L" level. Therefore, the CPU 6 could not be reset.

Figure 3:
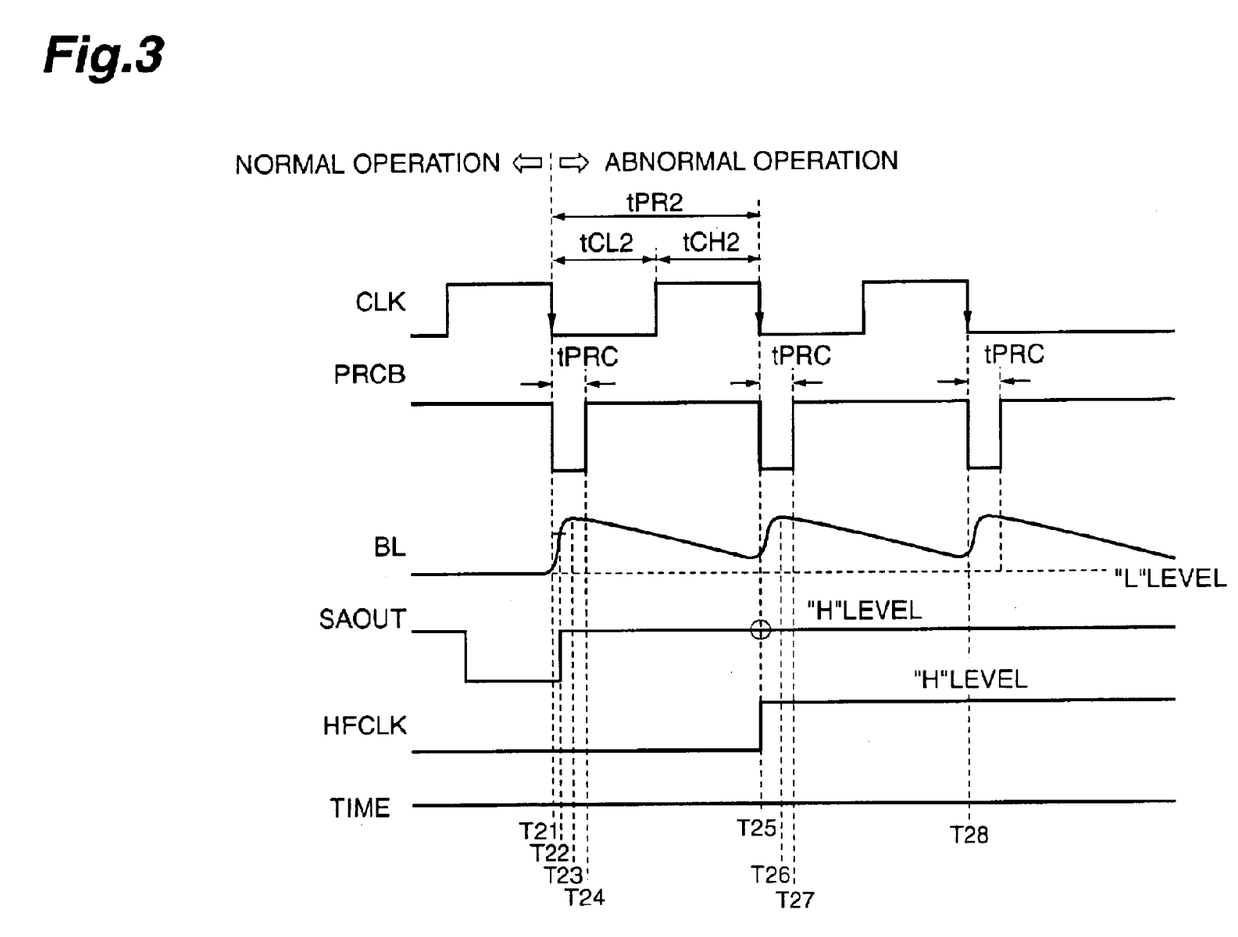
FIG. 3 is a timing chart showing states of signals in the wrong operation preventing circuit of embodiment 1 of the present invention while clock signal becomes abnormal.

Next, the abnormal operations in the circuit of embodiment 1 will be explained. That is, in this case, the cycle of the clock signal abnormally becomes shorter.

FIG. 3 is a timing chart showing states of signals in the wrong operation preventing circuit of embodiment 1 of the present invention while clock signal becomes abnormal.

In the FIG. 3, in sequence, the waveform of the clock signal (CLK), the waveform of the pre-charge signal (PRCB), the changing waveform of the bit line (BL), the output waveform of the inverter 4 (SAOUT), the waveform of HFCLK signal (HFCLK) and the time (T) are respectively being shown.

Here, let's assume that the normal operations become end by time T21 and the clock signal changed into abnormal state after the time T21.

<Time T21>

At this time, the clock signal starts to drop. Then, while the clock signal drops, the pre-charge signal (PRCB) becomes low level (i.e. "L" level).

Thus, on the one hand, the transistor p0 becomes on and the power source voltage (VDD) is added on the bit line.

On the other hand, just before T21, all of the transistors n0~n11 were on, and since the under terminal is connected with the ground voltage (VSS), the voltage on the bit line was "0" volt. But, at the time T21, because the pre-charge signal indicating "L" level is added respectively on the gates of the transistors n0 and n9, the transistors n0 and n9 become off. Thus, the transistor series formed from transistors n0~n11 is cut off, so the bit line becomes open state. Then, based on the resistance of the bit line and the transition response depending upon the floating capacity between the bit line and the ground, the voltage on the bit line starts to rise toward the VDD.

<Time T22>

At this time, the voltage on the bit line further rises, and when it is over the rising threshold value of the inverter 7, the output signal SAOUT rises into "H" level at once.

<Time T23>

At this time, the voltage on the bit line rose to VDD.

<Time T24>

At this time, the pre-charge signal changes into "H" level.

Then, the transistor p0 becomes off, and the transistors n0 and n9 respectively become on. Thus, the electric charge accumulated from time T21 to time T23, as floating capacity, starts to discharge based on the resistance of the bit line and the transition response depending upon the floating capacity between the bit line and the ground.

<Time T25>

At this time, the pre-charge signal, while synchronizing with clock signal, starts to drop into "L" level. Thus, the transistor p0 becomes on and results in that the VDD is added on the bit line.

However, with respect to the voltage on the bit line, just before the time T25, as shown by FIG. 3, it does not drop into the dropping threshold value of the inverter 7 yet, but now it must rise again. Thereby, the voltage on the bit line could not become under the dropping threshold value of the inverter 7. Thus, the output signal SAOUT also could not change into "L" level from "H" level, that is, keeps in the "H" level after the cycle of the clock signal once changed into shorter.

In such case, at the time T25, while the clock signal starts to drop, because the D-type flip-flop circuit 5 latched the SAOUT signal indicating "H" level, so the output HFCLK signal changes into "H" level from "L" level as shown in FIG. 3.

Then, the CPU 6, since received the HFCLK signal indicating "H" level, is reset.

Thereby, when the clock signal abnormally changed and resulted in that its cycle is abnormally shorter i.e. its frequency is abnormally higher, the voltage on the bit line will not be able to drop under the dropping threshold value of inverter 7. Based on this feature, by using the structure of the embodiment 1 as stated above, once the clock signal became abnormal, it is possible to reset the CPU 6 at once.

With respect to this feature, its formation has the following causes.

<Cause 1>

Because the cycle of the clock signal abnormally became shorter, before the discharging of the accumulated electric charge forming the floating capacity between the bit line and the ground does not end yet, the next cycle started.

<Cause 2>

In the case that the temperature of the semiconductor unit rise, because the floating capacity between the bit line and the ground becomes bigger, so the accumulated electric charge become more. Therefore, before the discharging of forming does not end yet, the next cycle started.

In the above explanation, the position that the memory cell section 1 is placed in semiconductor unit is not mentioned. In fact, it is desirable to place the memory cell section 1 at the furthest position from the sense amplifier 2. Thus, because the bit line must be longest, the floating capacity between the bit line and the ground and the resistance of the bit line become bigger together. Thereby, the transition response of the change on the bit line becomes slow. Because of this, abnormal state happens easily. In accordance with such placement, the safety rate for protecting semiconductor unit can be improved.

However, in the case that the memory cell section 1 is placed near the sense amplifier 2, by using a delay element with simple pulse and installing it in bit line, the same effects as the above also can be obtained. The delay element can be simply formed by resistance and condenser.

<Effects of the Embodiment 1>

As stated above, in the embodiment 1, at the first stage that the clock signal starts to abnormally change and will result in that the wrong operation happens in semiconductor unit, the CPU is reset. Therefore, the following effects can be obtained.

1. It is possible to prevent such accident as the destruction of data and the like from happening.
2. It is possible to widen the operation range of semiconductor unit without considering the unevenness of plural of semiconductor units with mass production.
3. The memory cell section and the operation judgement section are respectively formed by similar structure with other sections in semiconductor unit, it is not necessary to add producing process. As a result, the production cost can be reduced.

Moreover, in the embodiment 1, the wrong operation preventing circuit, not only can prevent the wrong operation due to the rising of the frequency of clock signal from happening, but also can prevent the wrong operation due to the rising of the temperature of memory from happening. That is, in the latter case, when the temperature of memory rises, because the floating capacity becomes further bigger, the discharging time of the electric charge becomes longer. Thus, the dropping of the pre-charge voltage added on bit line will become slow. Therefore, the pre-charge voltage, like that in the case that the clock signal changes abnormally, will change into abnormal waveform as shown by FIG. 3.

<Structure of Embodiment 2>

In the embodiment 2, such structure that the present invention is applied in semiconductor unit with a built-in non-volatile memory will be explained, serving as the non-volatile memory, EEPROM (Electrically Erasable Programmable Read Only Memory) is used.

Figure 4:
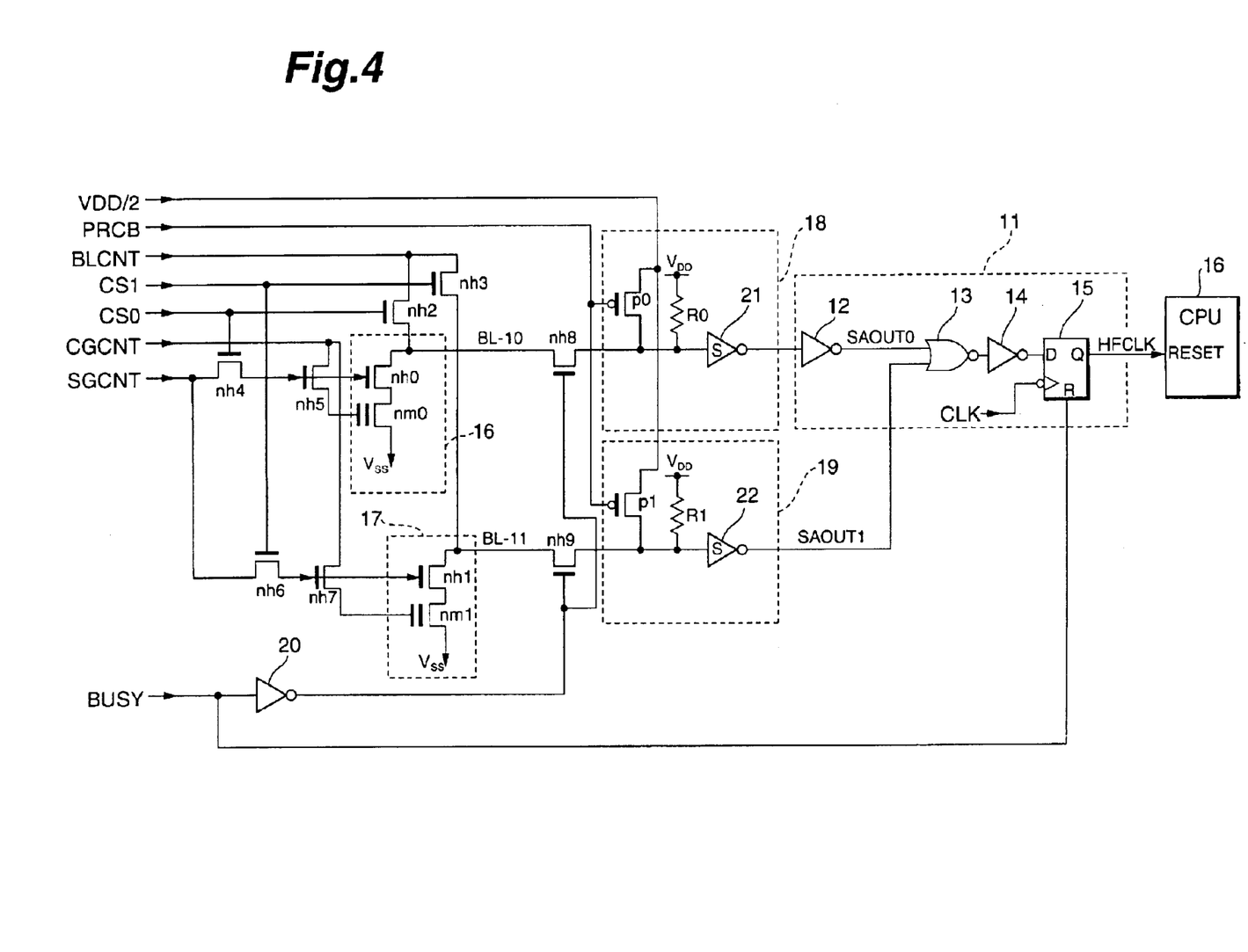
FIG. 4 is a circuit diagram showing a wrong operation preventing circuit of embodiment 2 of the present invention.

FIG. 4 is a circuit diagram showing a wrong operation preventing circuit of embodiment 2 of the present invention.

The wrong operation preventing circuit, as shown by FIG. 4, comprises memory cell sections 16 and 17; sense amplifiers 18 and 19; and operation judgement section 11. The memory cell sections 16 and 17 respectively serve as memory cell section for detection; the sense amplifiers 18 and 19 respectively serve as voltage detection section.

The memory cell section 16 is used to store writing data, is formed by memory cell such as other and newly installed in semiconductor unit, it is desirable that its installed position is furthest from sense amplifier 18. When such furthest position can not be realized due to the internal layout of semiconductor unit, it is desirable to set a delay element in bit line for obtaining equivalent state. Thus, the memory cell section 16 can become such part causing wrong operation easily.

The memory cell section 16 includes a transistor nh0 and a transistor nm0. The transistor nh0 is N-channel transistor with high pressure-resistant. The transistor nm0 is a EEPROM cell with floating tunnel oxide type, when its gate becomes "L" level, its drain becomes high voltage level and the both states are kept in a fixed time, it will becomes writing state; in opposition to this, when its gate becomes high voltage level, its drain becomes "L" level, it will becomes erasing state.

The drain of the transistor nh0 is connected with bit line BL10, on the drain, either high voltage level signal or "L" level signal is added. The source of the transistor nh0 is connected with the drain of the transistor nm0, and the source of the transistor nm0 is connected with the ground voltage (VSS). Further, on the gate of the transistor nh0, the SGCNT signal is input, and on the gate of the transistor nm0, the CGCNT signal is input.

The memory cell section 17 is used to store erasing data, is formed by memory cell such as other and newly installed in semiconductor unit, it is desirable that its installed position is furthest from sense amplifier 19. When such furthest position can not be realized due to the internal layout of semiconductor unit, it is desirable to set a delay element in bit line for obtaining equivalent state. Thus, the memory cell section 17 can become such part causing wrong operation easily.

The memory cell section 17 includes a transistor nh1 and a transistor nm1. The transistor nh1 is N-channel transistor with high pressure-resistant. The transistor nm1 is a EEPROM cell with floating tunnel oxide type, when its gate becomes "L" level, its drain becomes high voltage level and the both states are kept in a fixed time, it will becomes writing state; in opposition to this, when its gate becomes high voltage level, its drain becomes "L" level, it will becomes erasing state.

The drain of the transistor nh1 is connected with bit line BL11, on the drain, either high voltage level signal or "L" level signal is added. The source of the transistor nh1 is connected with the drain of the transistor nm1, and the source of the transistor nm1 is connected with the ground voltage (VSS). Further, on the gate of the transistor nh1, the SGCNT signal is input, and on the gate of the transistor nm1, the CGCNT signal is input.

The sense amplifier 18 is used to detect the change of the voltage on bit line BL10, includes a P channel transistor p0 with power source voltage level, a resistance R0 for pulling up and an inverter 21 with Schmidt trigger type. On the drain of the transistor p0, the half of the power source voltage i.e. VDD/2 is added, and on the source of the transistor p0, the bit line BL10 is connected. The resistance R0 pulls up the voltage of bit line BL10 at VDD. The inverter 21 amplifies the voltage change on bit line BL10, and when the input signal is over the threshold value in itself, outputs a "L" level signal thus results in that the SAOUT 0 signal mentioned below becomes "H" level.

The sense amplifier 19 is used to detect the change of the voltage on bit line BL11, includes a P channel transistor p1 with power source voltage level, a resistance R1 for pulling up and an inverter 22 with Schmidt trigger type. On the drain of the transistor p1, the half of the power source voltage i.e. VDD/2 is added, and on the source of the transistor p1, the bit line BL11 is connected. The resistance R1 pulls up the voltage of bit line BL11 at VDD. The inverter 22 amplifies the voltage change on bit line BL11, and when the input signal is over the threshold value in itself, outputs a SAOUT 1 signal with "H" level.

The operation judgement section 11 is installed in semiconductor unit, and is used for receiving the outputs of the sense amplifiers 18 and 19 and for detecting the wrong operations of the memory cell sections 16 and 17.

The operation judgement section 11 includes an inverter 12, a NOR gate 13, an inverter 14 and a D type flip-flop circuit 15. The inverter 12 receives the output signal of the sense amplifier 18 and inverts it, then outputs a SAOUT 0 to the one input terminal of the NOR gate 13.

With respect to the NOR gate 13, its one terminal receives the SAOUT 0, and its other terminal receives the SAOUT 1 output from the sense amplifier 19, then based on the both signals, it performs a NOR calculation. The inverter 14 inverts the output signal of the NOR gate 13 and outputs it to the D type flip-flop circuit 15.

The D-type flip-flop circuit 15 receives the output signal of the inverter 14 and clock signal, while the clock signal drops, latches the output signal and outputs a HFCLK signal to CPU 16. In the D-type flip-flop circuit 15, only in this case that the clock signal starts to drop when the output signal is indicating "H" level, the HFCLK signal will change into "H" level from low level. If the HFCLK indicates high level, the CPU 16 will be reset.

<Operations of the Embodiment 2>

In this embodiment, semiconductor unit contains the EEPROM. In the case that data is written into the EEPROM, since t is necessary to perform a time setting by timer or the like, wrong operation happens with difficulty. Thereby, the follows, only the operations of reading out will be explained.

That is, in the case that data is red out, by the control signal BUSY (FIG. 4), the N channel transistors with high pressure resistant nh8 and nh9 become on; by the control signal SGCN, the transistors nh0 and nh1 become on. Further, the transistor nm0 is previously set in on (writing state) and the transistor nm1 is previously set in off (erasing state).

Further, referring to FIG. 4, in the period of reading out, CS1, CS0 and SGCNT signals respectively indicate "H" level, BUSY signal indicates "L" level, BLCNT signal indicates a state of high impedance, and CGCNT signal indicates about 2 voltage.

Figure 5:
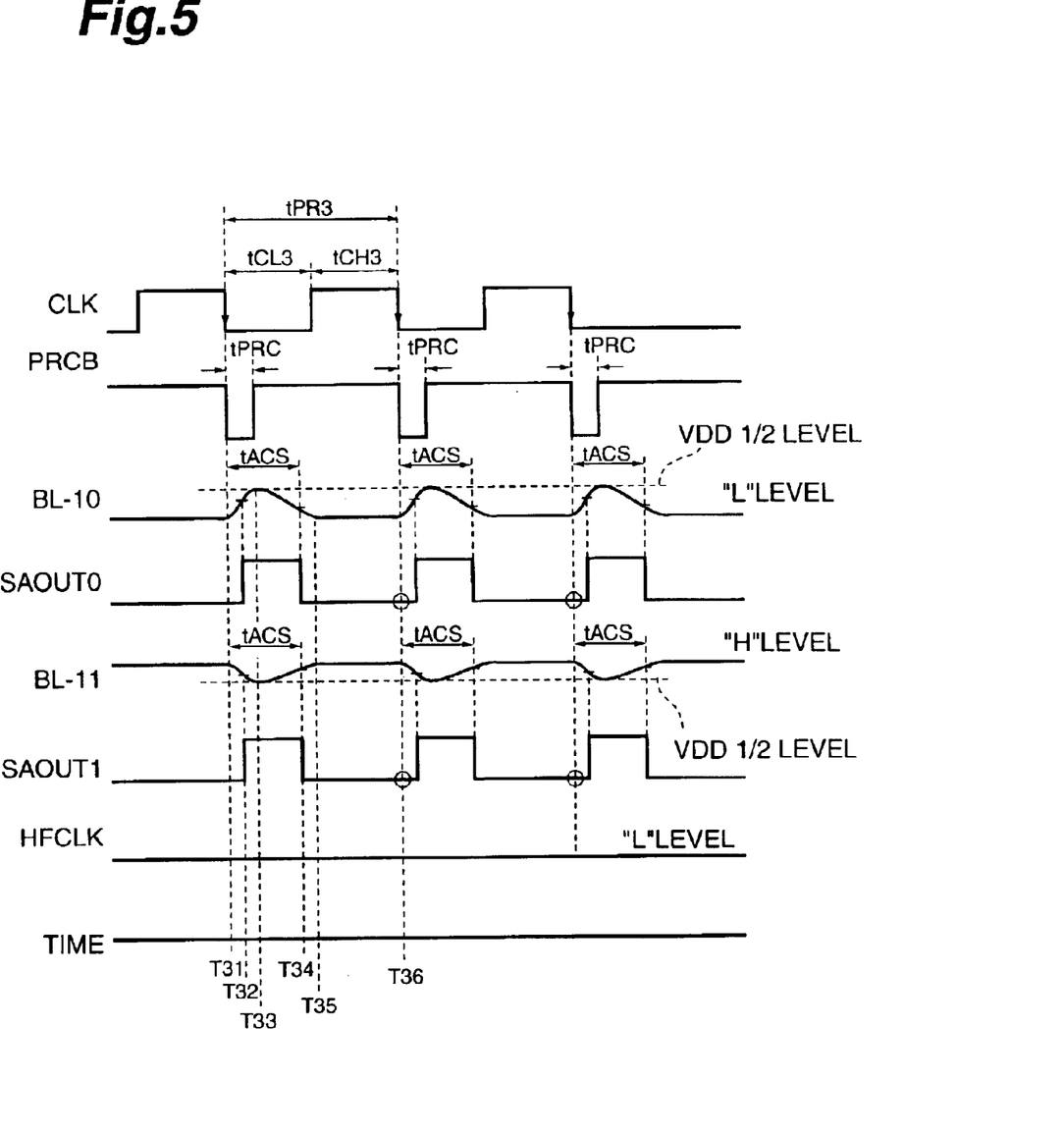
FIG. 5 is a timing chart showing states of signals in the wrong operation preventing circuit of embodiment 2 of the present invention while clock signal is normal.

FIG. 5 is a timing chart showing states of signals in the wrong operation preventing circuit of embodiment 2 of the present invention while clock signal is normal;

In the FIG. 5, in sequence, the waveform of the clock signal (CLK), the waveform of the pre-charge signal (PRCB), the changing waveform of the bit line BL10 (BL-10), the output waveform of the inverter 12 (SAOUT 0), the changing waveform of the bit line BL11 (BL-11), the output waveform of the inverter 22 (SAOUT 1), the waveform of HFCLK signal (HFCLK) and the time (T) are respectively being shown.

The follows, the normal operations in the circuit of the embodiment 2 will be explained along the time.

<Time T31>

At this time, the clock signal starts to drop, the while, the pre-charge signal (PRCB) becomes low level (i.e. "L" level).

Thus, the transistors p0 and p1 become on, then the power source voltage (VDD) is added on the bit lines BL10 and BL11.

Just before T31, on the one hand, since the transistors nh0 and nm0 were on and the source of the transistor nm0 is 0 connected with the ground voltage (VSS), so the voltage on the bit line BL10 was "0" volt; on the other hand, since the transistor nh1 was on and the transistor nm1 was off, so the voltage on the bit line BL11 was pulled up at power source voltage VDD via pulling up resistance R1.

However, at the time T1, on the one hand, the voltage on the bit line BL10 starts to rise forward the half of VDD based on the resistance of the bit line BL10 and the transition response depending upon the floating capacity between the bit line BL10 and the ground; on the other hand, the voltage on the bit line BL11 starts to drop forward the half of VDD based on the resistance of the bit line BL10 and the transition response depending upon the floating capacity between the bit line BL10 and the ground.

<Time T32>

At this time, on the one hand, the voltage on the bit line BL10 further rises and becomes over a threshold value of the inverter 21, thereby, the output signal SAOUT0 of the inverter 12 starts to rise into "H" level at once; on the other hand, the voltage on the bit line BL11 further drops and becomes under a threshold value of the inverter 22, thereby, the output signal SAOUT1 of the inverter 22 also starts to rise into "H" level at once.

<Time T33>

At this time, the pre-charge signal changes into "H" level. Thus, the transistors p0 and p1 become off.

Therefore, on the one hand, the electric charge accumulated from time T31 to time T32, as floating capacity, starts to discharge based on the resistance of the bit line BL10 and the transition response depending upon the floating capacity between the bit line BL10 and the ground. In accordance with such discharging, the voltage on the bit line BL10 starts to drop. In other words, the time to be need for dropping is corresponding to the floating capacity and the resistance.

On the other hand, the voltage on the bit line BL11 starts to rise by charging based on the transition response depending upon the floating capacity between the bit line BL11 and the ground.

<Time T34>

At this time, on the one hand, the voltage on the bit line BL10 further drops, and if it became under the dropping threshold value of inverter 21, the output signal SAOUT0 drops into "L" level at once; on the other hand, the voltage on the bit line BL11 further rises, and if it became over the rising threshold value of inverter 22, the output signal SAOUT1 drops into "L" level at once.

<Time T35>

At this time, the voltage on the bit line BL10 dropped into VSS and the voltage on the bit line BL11 rose into VDD.

<Time T36>

From time T5 to time T6, the voltage on the bit line BL10 is keeping in VSS and the voltage on the bit line BL11 is keeping in VDD. At the time T36, all signals respectively returned the states of time T31. That is, the interval from T31 to T36 is a cycle of clock signal, and corresponding to the cycle (tPR1) of clock signal, the other signals cyclically completed respective operations of one cycle. Thus, as shown by FIG. 5, at the time 36, the D-type flip-flop circuit 15, because latching the input signal indicating "L" level output from inverter 14 while the clock signal starts to drop, so outputs a HFCLK signal indicating "L" level. Therefore, the CPU 6 could not be reset.

Figure 6:
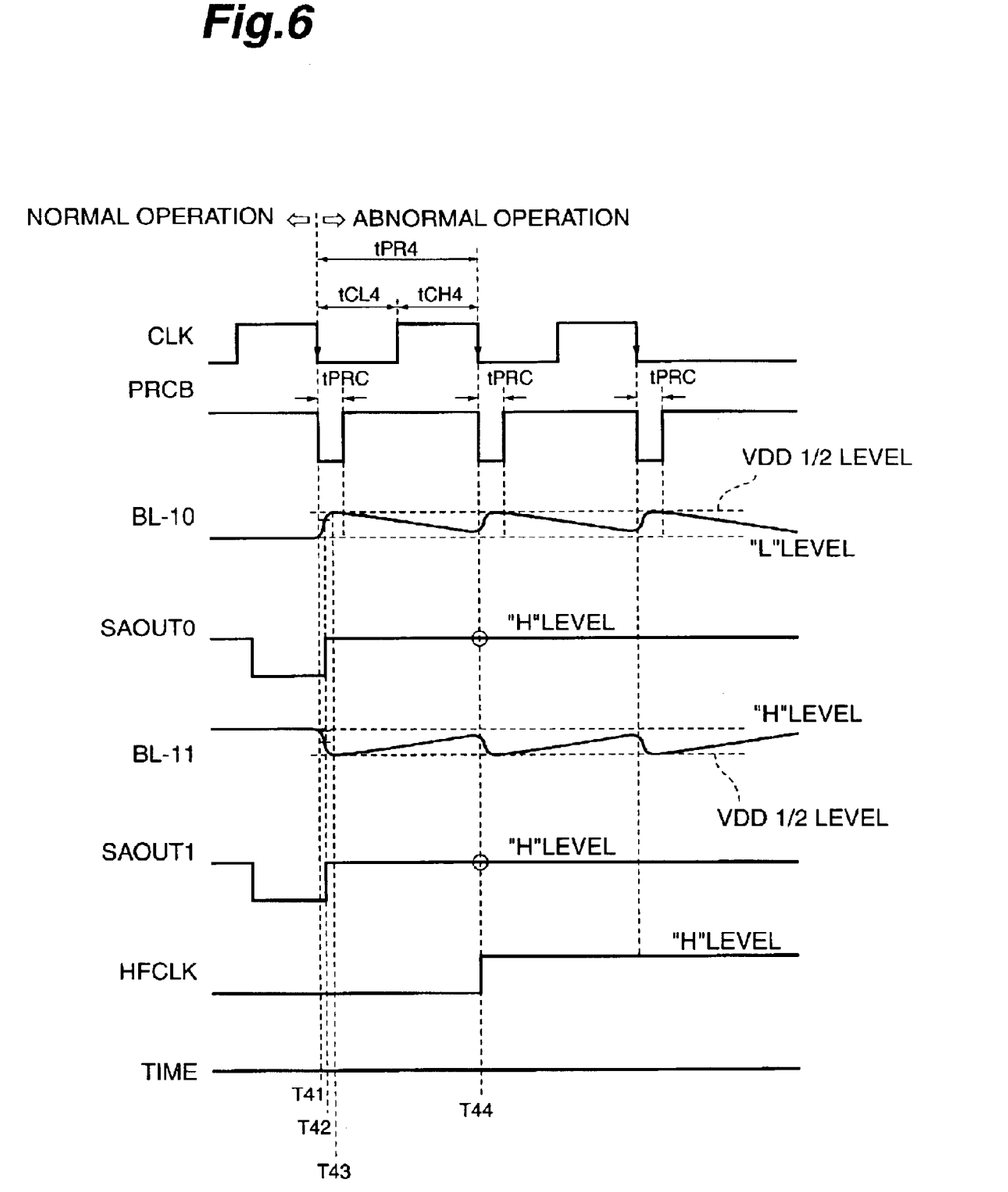
FIG. 6 is a timing chart showing states of signals in the wrong operation preventing circuit of embodiment 2 of the present invention while clock signal becomes abnormal.

Next, the abnormal operations in the circuit of embodiment 2 will be explained. That is, in this case, the cycle of the clock signal abnormally becomes shorter.

FIG. 6 is a timing chart showing states of signals in the wrong operation preventing circuit of embodiment 2 of the present invention while clock signal becomes abnormal.

In the FIG. 6, in sequence, the waveform of the clock signal (CLK), the waveform of the pre-charge signal (PRCB), the changing waveform of the bit line BL10 (BL-10), the output waveform of the inverter 12 (SAOUT 0), the changing waveform of the bit line BL11 (BL-11), the output waveform of the inverter 22 (SAOUT 1), the waveform of HFCLK signal (HFCLK) and the time (T) are respectively being shown.

Here, let's assume that the normal operations become end by time T41 and the clock signal changed into abnormal state after the time T41.

<Time T41>

At this time, the clock signal starts to drop, the while, the pre-charge signal (PRCB) becomes low level (i.e. "L" level).

Thus, the transistors p0 and p1 become on, then the power source voltage (VDD) is added on the bit lines BL10 and BL11.

Just before T31, on the one hand, since the transistors nh0 and nm0 were on and the source of the transistor nm0 is 0 connected with the ground voltage (VSS), so the voltage on the bit line BL10 was "O" volt; on the other hand, since the transistor nh1 was on and the transistor nm1 was off, so the voltage on the bit line BL11 was pulled up at power source voltage VDD via pulling up resistance R1.

However, at the time T41, on the one hand, the voltage on the bit line BL10 starts to rise forward the half of VDD based on the resistance of the bit line BL10 and the transition response depending upon the floating capacity between the bit line BL10 and the ground; on the other hand, the voltage on the bit line BL11 starts to drop forward the half of VDD based on the resistance of the bit line BL10 and the transition response depending upon the floating capacity between the bit line BL10 and the ground.

<Time T42>

At this time, on the one hand, the voltage on the bit line BL10 further rises and becomes over a threshold value of the inverter 21, thereby, the output signal SAOUT0 of the inverter 12 starts to rise into "H" level at once; on the other hand, the voltage on the bit line BL11 further drops and becomes under a threshold value of the inverter 22, thereby, the output signal SAOUT1 of the inverter 22 also starts to rise into "H" level at once.

<Time T43>

At this time, the pre-charge signal changes into "H" level.

Thus, the transistors p0 and p1 become off.

Therefore, on the one hand, the electric charge accumulated from time T31 to time T32, as floating capacity, starts to discharge based on the resistance of the bit line BL10 and the transition response depending upon the floating capacity between the bit line BL10 and the ground. In accordance with such discharging, the voltage on the bit line BL10 starts to drop. In other words, the time to be need for dropping is corresponding to the floating capacity and the resistance.

On the other hand, the voltage on the bit line BL11 starts to rise by charging based on the transition response depending upon the floating capacity between the bit line BL11 and the ground.

<Time T44>

At this time, the clock signal and the pre-charge signal respectively start again to drop for the operation of next cycle.

At the time T44, on the one hand, because the voltage on the bit line BL10 is dropping but is not under the dropping threshold value of inverter 21 yet, and further now must rise, so the output signal SAOUT0 can not change into "L" level; on the other hand, because the voltage on the bit line BL11 is rising but is not over the rising threshold value of inverter 22 yet, further now must drop, so the output signal SAOUT1 can not change into "L" level.

Thus, the output signals SAOUT0 and SAOUT1 are keeping in the "H" level. This because the cycle of the clock signal abnormally changed into shorter.

Therefore, at the time T44, while the clock signal starts to drop, because the D-type flip-flop circuit 15 latched the input signal indicating "H" level output from inverter 14, so the output HFCLK signal changes into "H" level from "L" level as shown in FIG. 6.

Then, the CPU 6, since received the HFCLK signal indicating "H" level, is reset.

Thereby, when the clock signal abnormally changed and resulted in that its cycle is abnormally shorter i.e. its frequency is abnormally higher, it is possible to reset the CPU 6 at once.

With respect to this feature, its formation has the following causes such as the embodiment 1.

<Cause 1>

Because the cycle of the clock signal abnormally became shorter, before the discharging of the accumulated electric charge forming the floating capacity between the bit line and the ground does not end yet, the next cycle started.

<Cause 2>

In the case that the temperature of the semiconductor unit rise, because the floating capacity between the bit line and the ground becomes bigger, so the accumulated electric charge become more. Therefore, before the discharging of forming does not end yet, the next cycle started.

In the embodiment 2, like the embodiment 1, with respect to the position of the memory cell section, it is desirable to place the memory cell section at the furthest position from the sense amplifier, and in the case that the memory cell section 1 is placed near the sense amplifier, it is desirable to insert a delay element with simple pulse.

<Effects of the Embodiment 2>

As stated above, in the embodiment 2, excepting there are the same effects as the embodiment 1, the wrong operation preventing circuit of the present invention can be applied in the semiconductor unit including EEPROM.

Moreover, the present invention, not only can be applied in the semiconductor unit including EEPROM as stated in the embodiment 2, but also can be applied in the semiconductor unit including other memory, for example, flash memory.

<Embodiment 3>

In the embodiment 3, such wrong operation preventing circuit applied in the semiconductor unit including Mask ROM and EEPROM will be explained.

Figure 7:
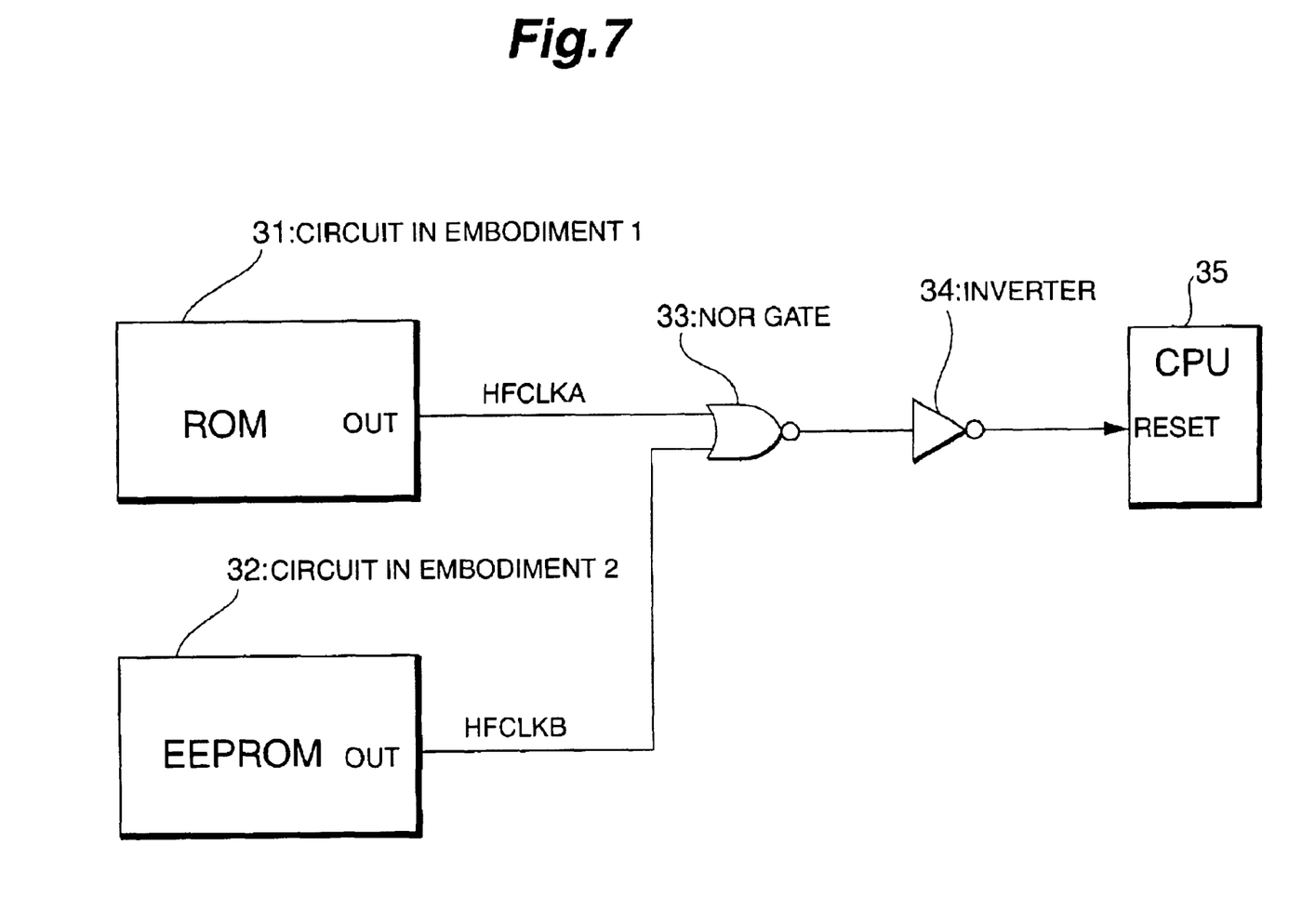
FIG. 7 is a block diagram showing a structure of the embodiment 3 of the present invention.

FIG. 7 is a block diagram showing a structure of the embodiment 3 of the present invention.

The wrong operation preventing circuit, as shown by FIG. 7, comprises a circuit 31 used in embodiment 1, a circuit 32 used in embodiment 2, a NOR gate 33 and a inverter 34 connecting with CPU 35.

The circuit 31 includes the memory cell section 2, sense amplifier 2 and operation judgement section 3 as stated in embodiment 1.

The circuit 32 includes the memory cell sections 16 and 17, sense amplifiers 18 and 19, and operation judgement section 11 as stated in embodiment 2.

As explained above, in the case of normal operation, the circuit 31 corresponding to Mask ROM outputs a HFCLKA signal indicating "L" level, the circuit 32 corresponding to EEPROM also outputs a HFCLKB signal indicating "L" level, therefore the CPU 35 can not be reset.

However, in the case of normal operation, at least one of the HFCLKA signal and the HFCLKA signal becomes "H" level, therefore the CPU 35 will be reset. Therefore, it is possible to prevent such accident as the runaway and the like from happening.

Moreover, expecting the Mask ROM and the EEPROM, when other kind memory is used in semiconductor unit, the wrong operation preventing circuit of the present invention also can be applied, in this case, by adding NOR gate, it is possible to deal easily and effectively.

<Effects of the embodiment 3>

In the embodiment 3, excepting there are the effects of the embodiments 1 and 2, the wrong operation preventing circuit of the present invention can be applied in such semiconductor unit including MASK ROM and EEPROM.

The present invention is not limited to the foregoing embodiments but many modifications and variations are possible within the spirit and scope of the appended claims of the invention.

What is claimed is:

1. A wrong operation preventing circuit for preventing the wrong operation of semiconductor unit including memory and CPU from happening, comprising:

a detection use memory cell section serving as a judgement object of said wrong operation, which is installed at said memory and is formed from at least one memory cell;

a bit line which is connected with said detection use memory cell section and is added by pre-charge voltage synchronizing with clock signal;

a voltage detection section for detecting the dropping of said pre-charge voltage added on said bit line;

a operation judgement section which outputs a reset signal to said CPU when the dropping voltage detected by said voltage detection section is bigger than a predetermined value.

2. The wrong operation preventing circuit according to claim 1, wherein said detection use memory cell section is any one of memory cell portions used for forming said memory.

3. The wrong operation preventing circuit according to claim 1, wherein said detection use memory cell section is a memory cell portion newly formed at said memory for detection exclusive use.

4. The wrong operation preventing circuit according to claim 1, wherein said bit line has a longest length than other bit lines connected with said memory.

5. The wrong operation preventing circuit according to claim 1, wherein said bit line has a delay element.

* * * * *